(12) United States Patent
Halls et al.

(10) Patent No.: US 7,510,885 B2
(45) Date of Patent: Mar. 31, 2009

(54) METHOD OF PREPARING ELECTRONICALLY CONNECTED OPTOELECTRONIC DEVICES, AND OPTOELECTRONIC DEVICES

(75) Inventors: Jonathan Halls, Cambridge (GB); Richard Wilson, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 457 days.

(21) Appl. No.: 10/540,007

(22) PCT Filed: Dec. 18, 2003

(86) PCT No.: PCT/GB03/05571

§ 371 (c)(1),
(2), (4) Date: Dec. 27, 2005

(87) PCT Pub. No.: WO2004/057674

PCT Pub. Date: Jul. 8, 2004

(65) Prior Publication Data

US 2006/0152833 A1 Jul. 13, 2006

(30) Foreign Application Priority Data

Dec. 20, 2002 (GB) ................... 0229653.1

(51) Int. Cl.
*H01L 21/00* (2006.01)
(52) U.S. Cl. ............... 438/22; 438/29; 257/40; 257/E31.123; 257/E39.007
(58) Field of Classification Search ............ 438/22, 438/24, 27–29; 257/40, 103, E31.123, E39.007
See application file for complete search history.

(56) References Cited

U.S. PATENT DOCUMENTS

| 4,623,751 A | 11/1986 | Kishi et al. ............. 136/244 |
| 5,294,869 A | 3/1994 | Tang et al. ............. 313/504 |
| 5,670,791 A | 9/1997 | Halls et al. ............. 257/40 |
| 5,935,585 A | 8/1999 | Bernardon et al. ......... 424/401 |
| 6,878,960 B2 * | 4/2005 | Yokoyama et al. ......... 257/40 |

FOREIGN PATENT DOCUMENTS

EP 949 850 B1 10/1999

(Continued)

OTHER PUBLICATIONS

International Search Report in PCT/GB03/05571 dated Oct. 8, 2004.

*Primary Examiner*—Hoai v Pham
(74) *Attorney, Agent, or Firm*—Marshall, Gerstein & Borun LLP

(57) ABSTRACT

A method of preparing a plurality of electrically connected organic optoelectronic devices on a substrate comprising firstly preparing a plurality of organic optoelectronic devices on a substrate, by the steps of providing a patterned layer of a first conductive material over the substrate, providing layer of organic optoelectronic material over the layer of first conductive material and providing a patterned layer of a second conductive material over the layer of organic optoelectronic material, at least partially removing regions of the organic optoelectronic material which are not covered by the patterned layer of second conductive material and secondly providing electrical connections to electrically connect at least two of the plurality of organic optoelectronic devices. The organic optoelectronic devices are suitably organic photovoltaic devices or organic electroluminescent devices.

14 Claims, 7 Drawing Sheets

FOREIGN PATENT DOCUMENTS

| | | |
|---|---|---|
| EP | 986 112 A2 | 3/2000 |
| EP | 986 112 A3 | 3/2000 |
| JP | 2002-313572 | 10/2002 |
| WO | WO 90/13148 | 11/1990 |
| WO | WO 97/42666 | 11/1997 |
| WO | WO 99/21935 | 5/1999 |
| WO | WO 99/49525 | 9/1999 |
| WO | WO 00/70655 A2 | 11/2000 |
| WO | WO 00/70655 A3 | 11/2000 |
| WO | WO 02/23579 A1 | 3/2002 |
| WO | WO 02/101838 A1 | 12/2002 |

* cited by examiner

METHOD OF PREPARING ELECTRONICALLY CONNECTED OPTOELECTRONIC DEVICES, AND OPTOELECTRONIC DEVICES

BACKGROUND OF THE INVENTION

1. Field of the Invention

The invention is directed to a method of preparing electronically connected optoelectronic devices such as organic electroluminescent devices and organic photovoltaic devices and to electrically connected devices obtained according to this method.

2. Brief Description of the Prior Art

The past decade has seen an increasing amount of research into the use of organic materials in optoelectronic devices, examples of such devices include organic electroluminescent devices, as disclosed in WO90/13148 and organic photovoltaic devices, as disclosed in U.S. Pat. No. 5,670,791. Both organic electroluminescent devices and organic photovoltaic devices are organic diodes comprising a layer of organic material between two electrodes. Organic electroluminescent devices emit light on the passage of a current between the two electrodes. Organic electroluminescent devices have a wide range of applications in the display industry. Organic photovoltaic devices generate a current between the two electrodes when light is incident upon the device. Organic photovoltaic devices are viewed as a replacement for inorganic silicon solar cells. Advantages associated with the use of organic optoelectronic devices include a greater flexibility in the design of materials and the tailoring of device properties, improved processability and lower cost.

In addition to applications in the field of displays, organic electroluminescent devices have great potential for use in large area lighting applications such as in panel lighting, emergency lighting and advertising. When developing organic electroluminescent devices for use in large area lighting, in addition to the problems which occur in display technology, the skilled person is presented with a range of further problems, in particular how to prepare a large area electroluminescent light source which can be operated at higher voltages, such as at mains voltage and which can be prepared in an efficient manner.

Organic photovoltaic devices have at present been used to generate voltages of around 1V, such low voltages have relatively few practical applications. It is known in the art to connect silicon based photovoltaic cells and dye-sensitised photovoltaic cells in series in order to provide a greater voltage output. A simple and efficient method for the series connection of organic photovoltaic cells would enable higher voltages to be generated and allow organic photovoltaic devices to access a wider range of applications.

The invention is directed to a method of preparing electronically connected optoelectronic devices such as organic electroluminescent devices and organic photovoltaic devices and to electrically connected devices obtained according to this method.

SUMMARY OF THE INVENTION

The invention provides a simple and efficient method for the preparation of a number of electrically connected optoelectronic devices on a single substrate. The method allows access to a range of applications including a plurality of series connected organic electroluminescent devices on a single substrate which can be driven at higher voltages than a single organic electroluminescent device, to arrangements of organic electroluminescent devices on a single substrate which can be driven to provide continuous light emission using an AC power source, to a plurality of series connected organic photovoltaic devices on a single substrate providing a higher output voltage and so enabling more practical applications and to a plurality of organic electroluminescent devices and organic photovoltaic devices on a single substrate. The method of the present invention obviates the need for external electrical connections between devices, simplifying processing and enabling a number of electrically connected devices to be encapsulated in a single, hermetically sealed package.

In a first embodiment the invention provides a method of preparing a plurality of electrically connected organic optoelectronic devices on a substrate the method
  including the steps of:
  a) preparing a plurality of organic optoelectronic devices comprising;
    i) providing a substrate,
    ii) providing a patterned layer of a first conductive material over said substrate,
    iii) providing a layer of organic optoelectronic material over said layer of first conductive material and
    iv) providing a patterned layer of a second conductive material over said layer of organic optoelectronic material, said patterned layer of second conductive material covering regions of said layer of organic optoelectronic material, said patterned layer of a second conductive material defining a plurality of optoelectronic devices,
  b) at least partially removing regions of said organic optoelectronic material which are not covered by said patterned layer of second conductive material, and
  c) providing electrical connections to electrically connect at least two of said plurality of organic optoelectronic devices.

Organic optoelectronic devices which may be prepared by the invention include organic diodes such as organic electroluminescent devices and organic photovoltaic devices and also organic transistors, organic photoluminescent devices, organic phosphorescent devices, organic resistors and organic capacitors. Organic electroluminescent devices and organic photovoltaic devices are preferred classes of organic optoelectronic devices. The substrate is preferably a single, unitary substrate at the time of carrying out the method according to the invention. The substrate may have a composite structure, for example, comprising layers of glass and plastic, plastic and ceramic or ceramic and metal.

The first conductive material may be patterned on deposition using additive techniques or patterned following deposition using subtractive techniques. Organic optoelectronic materials are organic materials with optical and/or electronic properties, such properties include electroluminescence, photoluminescence, fluorescence, photoconductivity and conductivity.

The second conductive material may be patterned on deposition using additive techniques or patterned following deposition using subtractive techniques. The patterned layer of second conductive material covers some regions of the organic optoelectronic material while leaving other regions uncovered or exposed. The patterned layer of second conductive material serves to define a plurality of optoelectronc devices, specifically the organic optoelectronic devices are defined by the areas of overlap of the first conductive material and the second conductive material. The patterned layer of second conductive material effectively acts as a mask, protecting the underlying layer of organic optoelectronic material during the process for the removal of the exposed organic optoelectronic material.

Electrical connectors are deposited to provide electrical connections between organic optoelectronic devices on the substrate.

Preferred methods or selectively removing said organic optoelectronic material comprise removing said organic optoelectronic material using a method selected from dry etching, laser ablation, wet etching, scribing, abrasive blasting or adhesive lift off. Dry etching is a more preferred method, in particular dry etching using an oxygen plasma such as an $O_2/CF_4$ plasma.

In a preferred embodiment the second conductive material partially overlies said first conductive material, such an arrangement enables electrical connections to be more readily made between neighbouring devices. Where the second conductive material only partially overlies the first conductive material removal of the organic optoelectronic material not covered by the second conductive material uncovers regions of the first conductive material. The removal of organic optoelectronic material from regions of the first conductive material enables electrical connection to be made between the first and second conductive materials of different organic optoelectronic devices in an efficient manner simply by depositing the connecting material such that it overlies the second conductive material of a first device and the first conductive material of a second device.

The connecting material may be deposited by thermal deposition, e-beam evaporation or, where a suitable conducting material is used, by printing techniques such as ink-jet printing or screen printing.

In order to prepare devices in which it is required that light enter or exit the device through either or both of the electrodes it is preferred that either said first conductive material and said substrate are at least semitransparent or said second conductive material is at least semitransparent. Where the first and second conductive materials are opaque light may enter or leave the device through the edge of the device.

Where it is desired to prepare an organic photovoltaic device it is preferred that said layer of organic optoelectronic material comprises at least an organic electron donor and at least an organic electron acceptor. Preferably at least one of said organic electron donor and said organic electron acceptor comprises a semiconductive organic polymer.

Alternatively to prepare an organic light emitting device it is preferred that said organic optoelectronic material comprises a light emitting polymer.

In a preferred embodiment said method further includes the step of providing a layer of hole injecting or hole transporting material over said patterned layer of first conductive material.

In a further embodiment the substrate may be a plastic substrate. Suitable plastics include acrylic resins, polycarbonate resins, polyester resins, polyethylene terephthalate resins and cyclic olefin resins.

The invention is also directed to organic optoelectronic devices prepared according to the above method, in particular the invention is directed to a plurality of electrically connected organic optoelectronic devices on a substrate obtainable according to the method of the invention. Preferred optoelectronic devices include organic photovoltaic devices and organic electroluminescent devices.

In a further embodiment the invention is directed to a substrate comprising both organic photovoltaic devices and organic electroluminescent devices.

DETAILED DESCRIPTION OF THE PREFERRED EMBODIMENTS

Figure 1A:
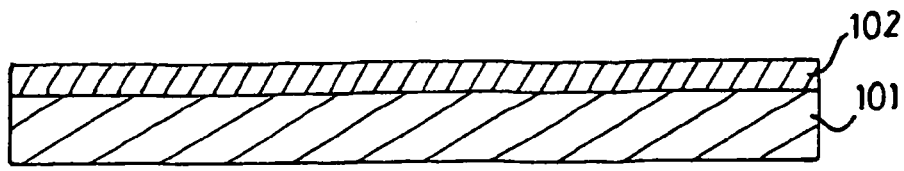
FIG. 1 illustrates a method of preparation of electrically connected organic optoelectronic devices according to the invention.

Methods suitable for the preparation of electrically connected organic optoelectronic devices are described with particular reference to organic photovoltaic devices. Clearly such methods have application in the preparation of other electrically connected organic optoelectronic devices such as organic electroluminescent devices, organic photoluminescent devices, organic transistors, non-light-emissive organic diodes, organic capacitors and organic resistors FIG. 1*f*) shows a plurality of series connected organic photovoltaic devices 110 on a substrate 101. Each photovoltaic device comprises an electrode comprising a high work function conducting material suitable for accepting positive charge carriers or holes from the device, known as the anode 102, a layer of organic photovoltaic material capable of converting incident light into electricity 103 and an electrode comprising a low work function material suitable for accepting negative charge carriers, or electrons, from the device, known as the cathode 104. Neighbouring devices are electrically connected by connectors of a suitable conducting material 105.

The mode of operation of organic photovoltaic devices will be briefly described. Organic photovoltaic diodes comprise a layer of organic photoconductive material between an anode and a cathode. Organic distributed heterojunction devices are one particularly efficient class of organic photovoltaic devices and operate in the following manner. The electrodes of different work function set up an internal electric field across the device. The organic layer comprises a mixture of a material having a higher electron affinity and a material having a lower electron affinity. Absorption of light by the materials of the organic layer generates bound electron-hole pairs, termed excitons. Excitons generated on the material of lower electron affinity dissociate by transfer of an electron to the material of higher electron affinity, the material of lower electron affinity is sometimes referred to as the electron donor or simply donor. Excitons generated on the material of higher electron affinity dissociate by transfer of a hole to the material of lower electron affinity, the material of higher electron affinity is sometimes referred to as the electron acceptor or simply acceptor. The electrons and holes generated by dissociation of the excitons then move through the device, with electrons moving to the lower work function cathode and holes moving to the higher work function anode. In this way light incident on the device generates a current which may be used in an external circuit.

The substrate 101 of the organic photovoltaic device should provide mechanical stability to the device and act as a barrier to seal the device from the environment. Where it is desired that light enter or leave the device through the substrate, the substrate should be transparent or semi-transparent. Glass is widely used as a substrate due to its excellent barrier properties and transparency. Other suitable substrates include ceramics, as disclosed in WO02/23579 and plastics such as acrylic resins, polycarbonate resins, polyester resins, polyethylene terephthalate resins and cyclic olefin resins. Plastic substrates may require a barrier coating to ensure that they remain impermeable. The substrate may comprise a composite material such as the glass and plastic composite disclosed in EP0949850.

The anode 102 comprises a high work function material suitable for accepting holes into the layer of organic photovoltaic material. Suitable anode materials typically have a work function of greater than 4.3 eV and may be selected from the group comprising indium-tin oxide (ITO), tin oxide, aluminum or indium doped zinc oxide, magnesium-indium oxide, cadmium tin-oxide, gold, silver, nickel, palladium and platinum. Conducting organic polymers such as polyaniline and polythiophene and their derivatives may also be used as the anode material. The anode material may be deposited upon the substrate using any appropriate technique such as sputtering, vapour deposition, printing, including ink-jet printing, screen printing and flexographic printing, or spraying. The anode material may be patterned post-deposition by a subtractive technique such as photolithography. Alternatively the anode material may be patterned during deposition by an additive technique such as screen printing.

Figure 1B:
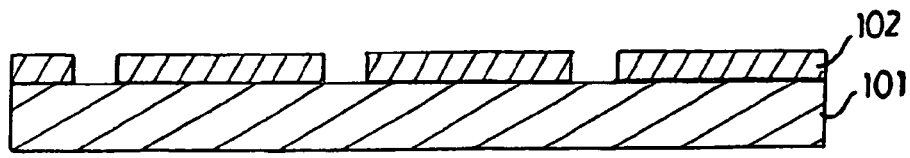

FIG. 1a) shows a layer of anode material 102 overlying a substrate 101. FIG. 1b) shows a layer of anode material 102 having been patterned by a subtractive technique overlying a substrate 101, the substrate is exposed at portions where the material forming the anode has been removed.

In order to improve efficiency the organic photovoltaic device may include further organic layers between the anode and cathode to improve charge extraction and transport. In particular a layer of hole-transporting material may be situated over the anode. The hole-transport material serves to increase charge conduction through the device. The preferred hole-transport material used in the art is a conductive organic polymer such as polystyrene sulfonic acid doped polyethylene dioxythiophene (PEDOT:PSS) as disclosed in WO98/05187, although other hole transporting materials such as doped polyaniline or TPD (N,N'-diphenyl-N,N'-bis(3-methylphenyl)[1,1'-biphenyl]-4,4'-diamine) may also be used. The layer of hole transporting material may be deposited by any suitable technique such as vapour deposition or, where the hole transporting material is soluble, solution processing techniques such as spin-coating, screen-printing or ink-jet printing may be used.

The organic photovoltaic material 103 preferably comprises an electron donor and electron acceptor. The electron donor and acceptor may comprise polymers or low molecular weight compounds. The electron donor and acceptor may be present as two separate layers, as disclosed in WO99/49525, or as a blend, as disclosed in U.S. Pat. No. 5,670,791, a so called bulk heterojunction. The electron donor and acceptor may be selected from perylene derivatives such as N,N'-diphenylglyoxaline-3, 4, 9, 10-perylene tetracarboxylic acid diacidamide, fullerenes ($C_{60}$), fullerene derivatives and fullerene containing polymers and semiconducting organic polymers such as polyfluorenes, polybenzothiazoles, polytriarylamines, poly(phenylenevinylenes), polyphenylenes, polythiophenes, polypyrroles, polyacetylenes, polyisonaphthalenes and polyquinolines. Preferred polymers include MEH-PPV (poly(2-methoxy, 5-(2'-ethyl)hexyloxy-p-phenylenevinylene)), MEH-CN-PPV (poly(2,5-bis (nitrilemethyl)-1-methoxy-4-(2'-ethyl-hexyloxy) benzene-co-2,5-di-aldehyde-l-methoxy4-(2'-ethylhexyloxy) benzene)) and CN-PPV cyano substituted PPV, polyalkylthiophenes, such as poly(3-hexylthiophene), POPT poly(3(4-octylphenyl) thiophene) and poly(3-dodecylthiophene), polyfluorenes, such as poly(2,7-(9,9-di-n-octylfluorene), poly(2,7-(9,9-di-n-octylfluorene)-benzothiadiazole) and poly(2,7-(9,9-di-n-octylfluorene)-(4,7-di-2-thienyl-(benzothiazole)). Typical device structures include a blend of N, N'-diphenylglyoxaline-3, 4, 9, 10-perylene tetracarboxylic acid diacidamide and poly(3-dodecylthiophene), a layered structure comprising a layer of MEH-PPV and a layer of $C_{60}$, a blend of MEH-PPV and $C_{60}$, a layered structure comprising a layer of MEH-CN-PPV and a layer of POPT, a blend comprising MEH-PPV and CN-PPV and a blend comprising poly(3-hexylthiophene) and poly(2,7-(9,9-di-n-octylfluorene)-(4,7-di-2-thienyl-(benzothiazole))

Figure 1C:
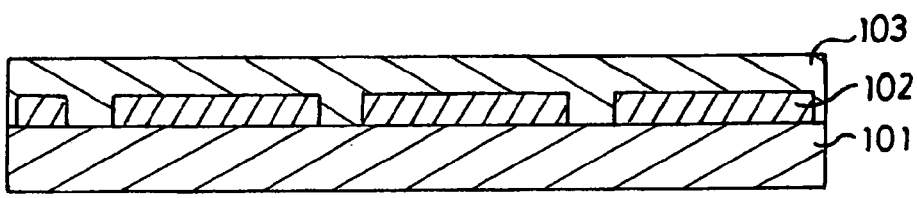

The organic photovoltaic material may be deposited by any suitable technique. Where the organic photovoltaic materials are insoluble vapour deposition will be the preferred method. Where the organic photovoltaic materials are soluble solution processing deposition techniques will be preferred. Suitable solution processing techniques include spin-coating, dip-coating, doctor-blade coating, spraying, screen-printing, ink-jet printing and gravure printing. FIG. 1c) shows a substrate 101, a patterned anode 102 and a layer of organic photovoltaic material 103 which has been deposited over the substrate and anode using a coating technique such as spin-coating.

The organic photovoltaic device may include a further layer of electron accepting or hole blocking material between the layer of organic photovoltaic material 103 and the cathode 104.

The cathode 104 comprises a layer of material of low work function. Examples of suitable materials for the cathode include Li, Na, K, Rb, Be, Mg, Ca, Sr, Ba, Yb, Sm and Al. The cathode may comprise an alloy of such metals or an alloy of such metals in combination with other metals, for example the alloys MgAg and LiAl. The cathode preferably comprises multiple layers, for example Ca/Al or LiAl/Al. The device may further comprise a layer of dielectric material between the cathode and the emitting layer, such as is disclosed in WO 97/42666. In particular it is preferred to use an alkali or alkaline earth metal fluoride as a dielectric layer between the cathode and the emitting material. Preferred cathode structures include LiF/Ca/Al and $BaF_2$/Ca/Al. In some cases it may be desired that the cathode be transparent, for example when an opaque substrate or anode is used or where it is desired that the whole device be transparent. Suitable transparent cathodes include a cathode comprising a thin layer of highly conductive material such as Ca and a thicker layer of transparent conducting material such as ITO, a preferred transparent cathode structure comprises $BaF_2$/Ca/Au. The cathode is typically deposited by vapour deposition or sputtering.

Figure 1D:
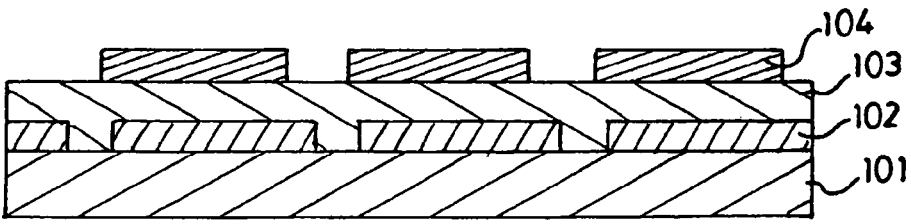
Figure 1E:
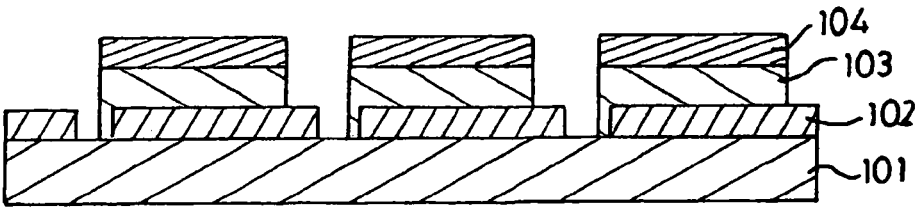

FIG. 1d) shows a substrate 101, a patterned anode 102, a layer of organic photovoltaic material 103 and a patterned cathode 104. The cathode is deposited over the organic photovoltaic material to form a pattern, this is typically achieved by depositing the cathode material as a vapour through a shadow mask. Alternative methods of patterning the cathode include printing and photolithography. The patterned regions of anode and cathode material define a series of organic photovoltaic devices, each device comprising an anode, an opposing cathode and organic photovoltaic material situated between. FIG. 1d) shows the cathode of each device partially overlying the anode of each device i.e. the cathode covers a large portion of the anode but is slightly offset to the anode such that at one edge of the device the cathode overhangs the anode and at the other edge of the device the cathode does not completely cover the anode. It should be noted that, being conductive, the organic photovoltaic material does provide some degree of electrical connection between neighbouring photovoltaic devices but owing to the high resistance of the organic photovoltaic material this is not sufficient to provide an effective electrical connection of the devices.

In order to effectively electrically connect the organic photovoltaic devices it is necessary to remove the organic photovoltaic material and any other organic materials which have been deposited, such as hole transporting materials, from regions which are not covered by the cathode material. The organic photovoltaic material may be removed by an etching technique or a mechanical technique. During the removal of the organic optoelectronic material the cathode effectively acts as a mask, defining which areas are to be removed i.e. the uncovered portions of organic optoelectronic material and also protecting the organic optoelectronic material of the organic optoelectronic devices from damage.

Suitable etching techniques include wet etching wherein the exposed regions of organic photovoltaic material are subjected to etching using a solvent in which the organic materials are soluble, for example toluene may be used to remove the organic photovoltaic layer and methanol may be used to remove the PEDOT layer. Alternatively the organic material may be removed using a more aggressive etching solution such as an acidic solution, provided that this solution does not damage the material of the cathode. The organic material may be removed using dry etching wherein the organic material is exposed to a gaseous or plasma etching material, suitable dry etching materials include oxygen plasma.

Mechanical techniques for removing the organic photovoltaic material include scribing the organic material with a sharp instrument, blasting the organic material with fine particles of abrasive material, bombarding the organic material with ions, lifting off organic material by contacting the organic material with a sheet of adhesive and then lifting off the sheet or removing the organic material using laser ablation.

The most efficacious methods for removal of the organic optoelectronic material have been found to be dry etching and laser etching. Both methods allow the complete removal of exposed organic optoelectronic materials whilst not exposing the organic optoelectronic devices to potentially harmful solvents. A suitable dry etching method involves exposing the organic optoelectronic devices to an RF or microwave induced $O_2/CF_4$ plasma for a period of between 30 and 360 seconds, preferably of between 60 and 240 seconds. An advantage of $O_2/CF_4$ plasma etching is that it efficiently removes both the organic optoelectronic material and additional organic layers which are generally included in the devices, in particular the polythiophene derivative PEDOT:PSS which is widely used as a hole transport material.

Laser ablation has also been found to be a suitable technique for the removal of the organic optoelectronic material. Laser ablation involves the use of a pulsed laser having a pulse energy density of 0.4 to 1.2 $J/cm^2$, a pulse rate of 50 to 150 Hz and a spot size of radius 2 to 20 mm. The laser and the substrate comprising the organic optoelectronic devices are moved in relation to each other such that the laser is focussed on the areas of exposed organic optoelectronic material causing this material to vaporise and so removing it from the substrate.

Figure 1F:
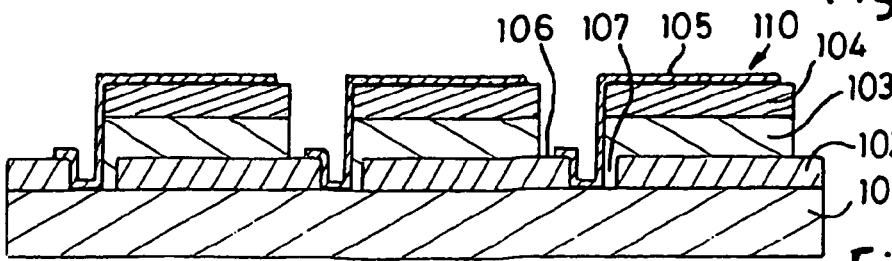

Following removal of the organic optoelectronic material from regions between the devices the devices may be electrically connected by the deposition of electrical contacts between devices. FIG. 1f) shows a series of organic photovoltaic devices 110 electrically connected by a number of aluminum contacts 105. Electrical contacts may be made between any devices on a substrate although generally contacts are made between neighbouring devices. The electrical contacts may be formed by depositing an electrically conducting material between devices. Deposition may be carried out using a shadow mask whereby a conducting material such as aluminum is deposited as a vapour on specific regions of the substrate through a patterned mask. Alternatively a suitable conductor may be printed onto the substrate by a technique such as screen printing or ink-jet printing. Suitable conducting materials for printing include silver resin pastes, graphite resin pastes and organic conducting materials such as PEDOT:PSS and polyaniline.

To facilitate the connection of the organic optoelectronic devices it is preferred that the cathode only partially overlies the anode. The effect of this is that on removal of the organic optoelectronic material not covered by the cathode a region of anode is also exposed, this can be readily seen at feature 106 FIG. 1f). The region of exposed anode can then be connected to a neighbouring cathode through the deposition of the electrical connector 105. An advantage of this arrangement is that in overlapping the anode, the cathode also provides that a region of optoelectronic material 107 remains between the cathode and the substrate. This region of organic optoelectronic material serves to insulate the anode of the neighbouring device from the connector 105.

The organic optoelectronic device is provided with an encapsulation means which acts to seal the device from the atmosphere. Suitable methods of encapsulation include covering the device on the cathode side with a metal can or glass sheet or providing an impermeable film over the device, such as a film comprising a stack of polymer layers and inorganic layers.

The above embodiment is described with reference to an organic photovoltaic device. The method of the present invention may also be advantageously applied to the preparation of electrically connected organic electroluminescent devices. Organic electroluminescent devices comprise, on a substrate, a high work function anode, an optional layer of hole transporting material, a layer of organic light emitting material and a cathode. Suitable materials, and methods for their deposition and patterning, for the substrate, anode, hole transporting layer and the cathode are as described above in relation to organic photovoltaic devices.

Organic light emitting materials for use in organic light emitting devices include polymeric light emitting materials, such as disclosed in Bernius et al Advanced Materials, 2000, 12, 1737, low molecular weight light emitting materials such aluminum trisquinoline, as disclosed in U.S. Pat. No. 5,294, 869, light emitting dendrimers as disclosed in WO99/21935 and phosphorescent materials as disclosed in WO00/70655. The light emitting material may comprise a blend of a light emitting material and a fluorescent dye or may comprise a layered structure of a light emitting material and a fluorescent dye. Due to their processability soluble light emitting materials are preferred, in particular soluble light-emitting polymers. Light emitting polymers include polyfluorene, polybenzothiazole, polytriarylamine, poly(phenylenevinylene) and polythiophene. Preferred light emitting polymers include homopolymers and copolymers of 9,9-di-n-octylfluorene (F8), N,N-bis(phenyl)4-sec-butylphenylamine (TFB) and benzothiadiazole (BT).

In a particularly advantageous application of the method of the invention the substrate comprises a flexible, impervious plastic material such as an acrylic resin, a polycarbonate resin, a polyester resin, a polyethylene terephthalate resin or a cyclic olefin resin, or a laminate comprising a plastic resin and an impervious inorganic material. A device on a plastic substrate may be prepared in a so-called roll-to-roll or web process whereby the organic materials are deposited by solution deposition techniques such as printing or spraying. The inventive method has the advantage that, where suitable materials are selected, the electrical connectors can be deposited by the aforementioned solution processing techmques.

The method of the invention allows access to a variety of arrangements of electrically connected organic optoelectronic devices which hitherto could only be obtained using complex multistep techniques or through the integration of a number of separate units. The following describes a number of arrangements of organic optoelectronic devices which are made readily accessible by the method of the present invention.

The method of the present invention allows access to a variety of arrangements of electrically connected organic optoelectronic devices which hitherto could only be obtained using complex multistep techniques or through the integration of a number of separate units. The following describes a number of arrangements of organic optoelectronic devices which are made readily accessible by the method of the present invention.

The series connection of photovoltaic devices allows higher voltages to be obtained. A typical organic photovoltaic cell has an open circuit voltage of around 1V. Such low voltages are insufficient to power even low energy demanding applications such as calculators and watches. The present invention provides a method whereby several organic photovoltaic cells can be connected in series on a single substrate, allowing greater voltages to be generated. In addition the present invention has the advantage that the connected organic photovoltaic cells lie on a single substrate allowing easier integration of the unit into electronic devices.

FIG. 2 shows a method for preparing a substrate comprising four series connected organic photovoltaic cells. A substrate 201 comprising a patterned layer of ITO 202 is prepared using photolithography. The ITO is patterned such that it defines the areas of the four eventual photovoltaic cells FIG. 2a). A layer of hole transporting PEDOT:PSS is deposited over the ITO by spin-coating (not shown). A layer comprising a blend of poly(3-hexylthiophene) and poly(2,7-(9,9-di-n-octylfluorene)-(4,7-di-2-thienyl-(benzothiazole)) is then spin-coated over the layer of PEDOT:PSS (not shown). Following deposition of the organic layers the device cathodes are deposited. The cathodes comprise a layer of aluminum of thickness 300 nm and are deposited by vapour deposition through a shadow mask. FIG. 2b) shows the pattern of the cathodes 203 deposited over the organic layers. The cathodes are patterned such that the cathode at least partially overhangs the anode. The organic layers which are not covered by the cathode are then removed by exposure to an $O_2/CF_4$ plasma. Metal interconnects are deposited over the cathodes to provide electrical connections between neighbouring devices. The pattern of the interconnects 204 is shown in FIG. 2c). The series connected devices are finally encapsulated with a glass sheet placed over the cathodes of the devices and adhered to the substrate using a UV curing epoxy resin.

Figure 2A:
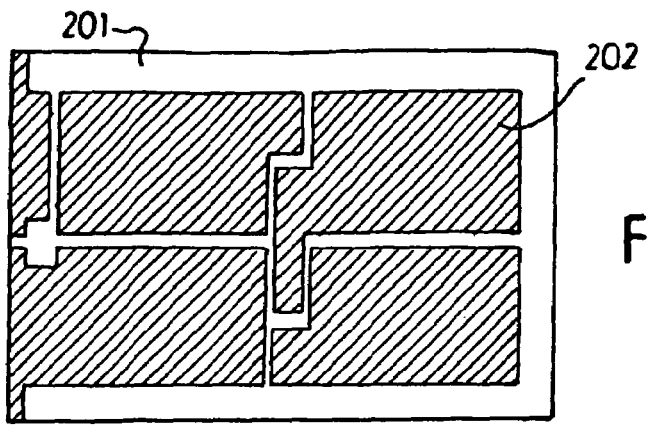
FIG. 2 shows a method of preparing series connected organic optoelectronic devices.
Figure 2B:
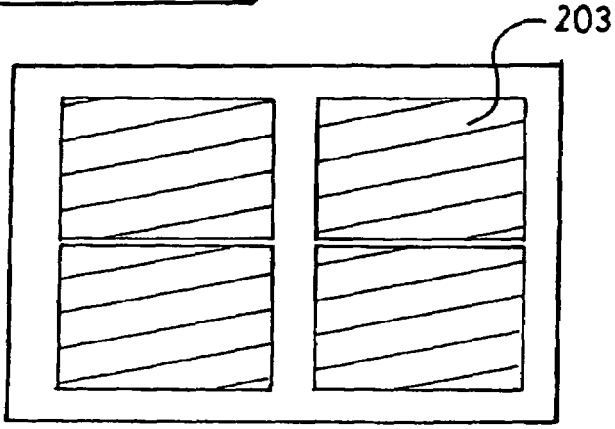
Figure 2C:
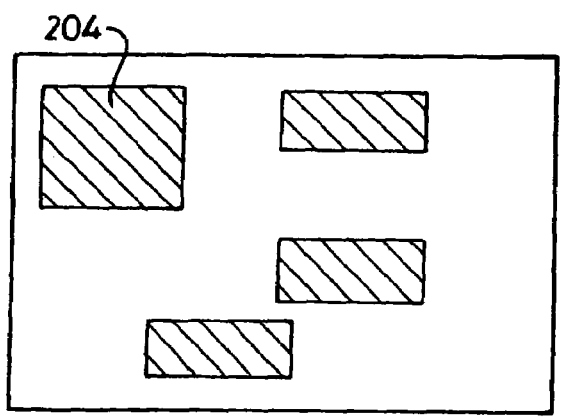
Figure 2D:
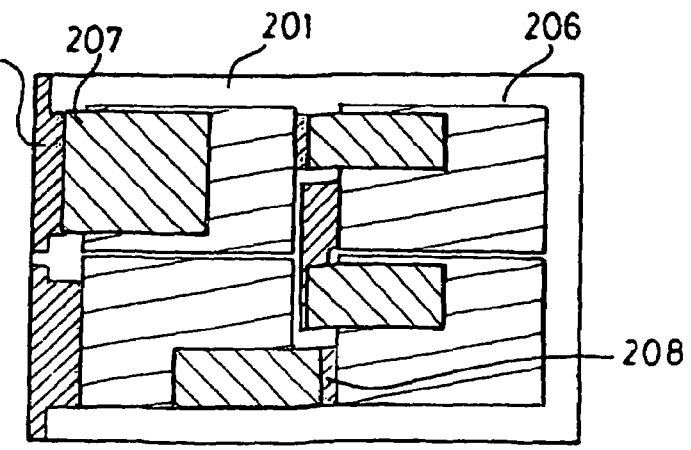

FIG. 2d) shows a substrate 201 comprising four series connected organic photovoltaic devices. The devices are comprised of an anode 202 and a cathode 206 with layers of organic optoelectronic material between the two electrodes. The devices are electrically connected by connectors 207. Feature 208 shows a region of anode material which has been exposed by the plasma treatment and is connected to the cathode of a neighbouring organic photovoltaic device.

Organic electroluminescent devices generally operate at voltages in the region of 1 to 15V. For applications in domestic, commercial and industrial lighting it is preferable that the light source is driven from mains voltage, for example 240V. To drive organic electroluminescent devices from mains voltage therefore requires the use of a transformer. The present invention provides a method for connecting a number of organic light emitting devices in series, these series connected devices can be driven a higher voltages and do not require the use of a transformer or other voltage conversion means. Series connected organic electroluminescent devices may be prepared by the above described method for the preparation of series connected organic photovoltaic devices with the layer of organic photovoltaic material being replaced by an organic electroluminescent material such as poly(9,9-di-n-octylfluorene). Other arrangements of organic electroluminescent devices may also be prepared such as series connected organic electroluminescent which may be driven by AC voltages.

Figure 3A:
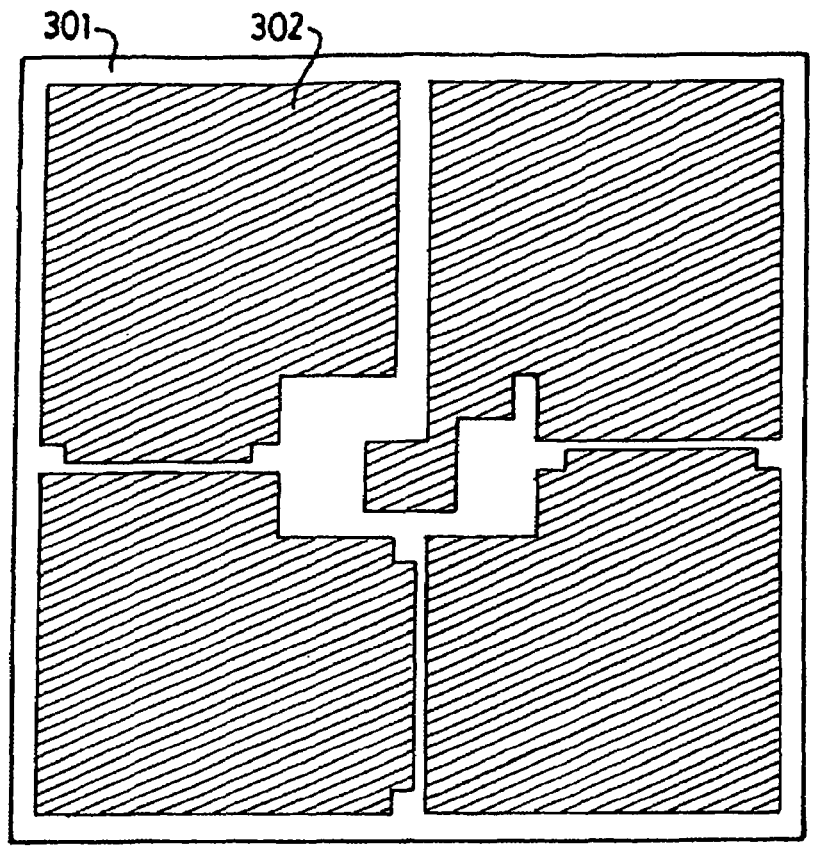
FIG. 3 shows a method of preparing a device on a single substrate includes a combination of organic electroluminescent devices and organic photovoltaic devices.
Figure 3B:
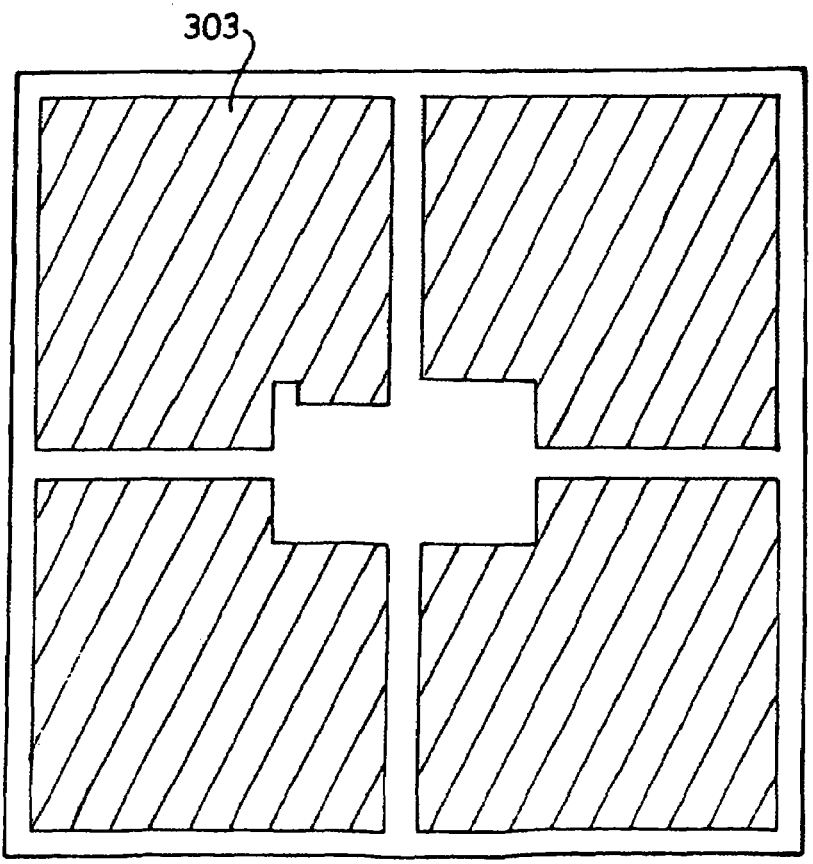
Figure 3C:
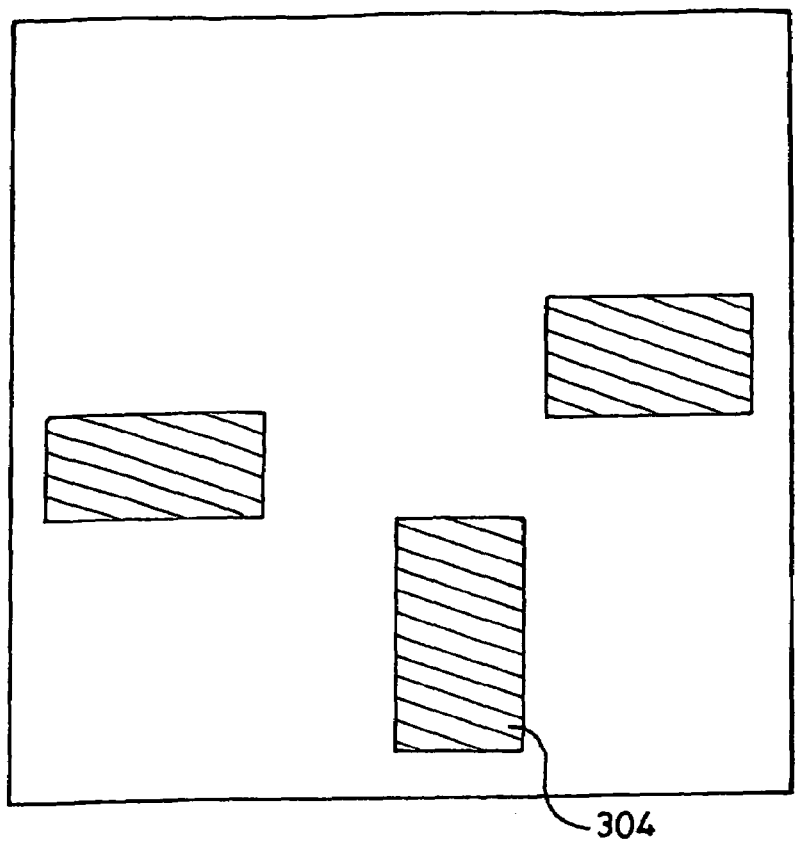
Figure 3D:
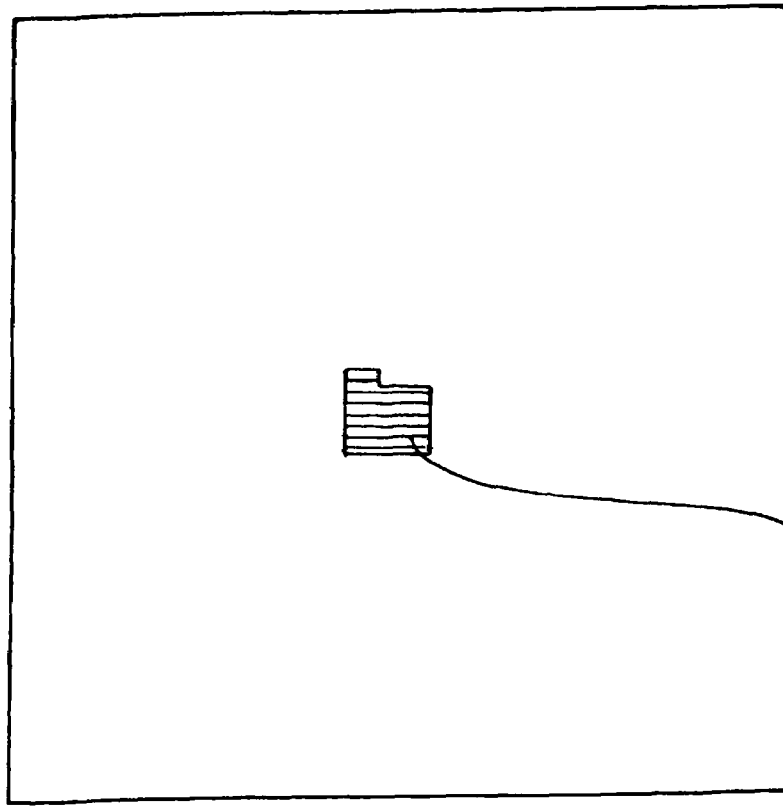
Figure 3E:
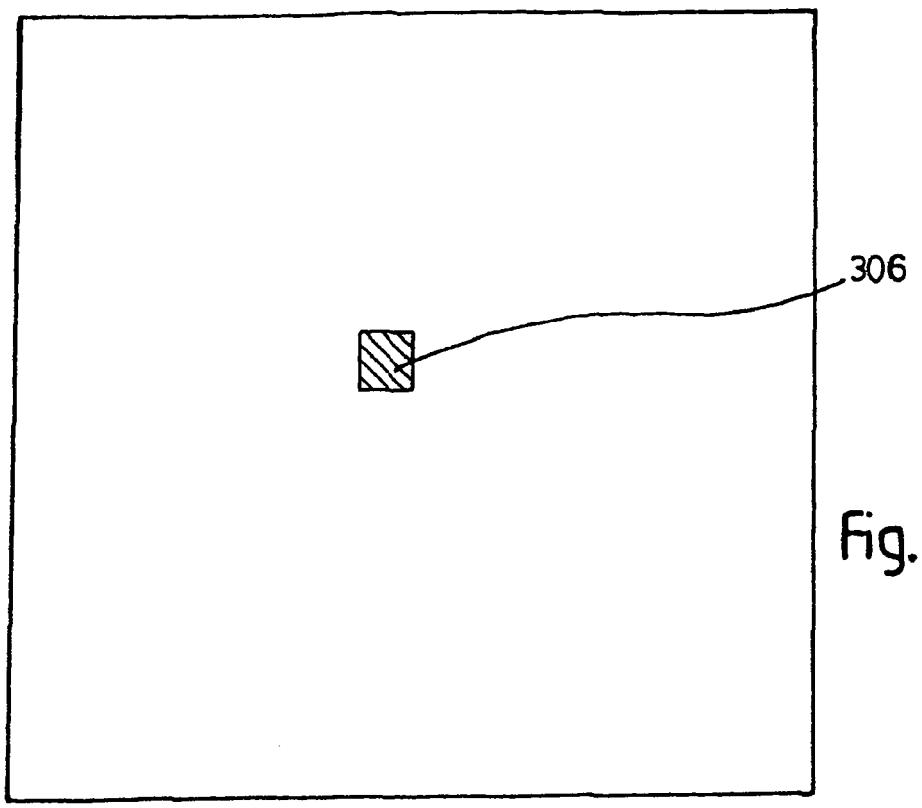

The method of the invention may be used to provide substrates comprising electrically connected organic photovoltaic devices and organic electroluminescent devices. The advantages of such an arrangement are that the organic photovoltaic devices may be used to drive the organic electroluminescent devices so providing a source of illumination or an information display which requires neither a connection to a grid power supply nor a power source such as a battery. FIG. 3a) shows a substrate 301 comprising a patterned layer of ITO 302 acting as an anode, the anode is patterned to define four organic photovoltaic devices around the edges of the substrate and an organic electroluminescent device at the centre of the substrate. A layer of hole transporting PEDOT:PSS is deposited over the ITO by spin-coating (not shown). A layer comprising a blend of poly(3-hexylthiophene) and poly(2,7-(9,9-di-n-octylfluorene)-(4,7-di-2-thienyl-(benzothiazole)) is then spin-coated over the layer of PEDOT:PSS (not shown). Following deposition of the organic layers the device cathodes are deposited. The cathodes comprise a layer of aluminum of thickness 300 nm and are deposited by vapour deposition through a shadow mask. FIG. 3b) shows the shape of the cathodes 303 of the organic photovoltaic devices which are deposited through the shadow mask. The exposed organic material is then removed by plasma etching and the organic photovoltaic devices are electrically connected using connectors 304 having the shape shown in FIG. 3c). In order to prepare the organic electroluminescent device a layer of PEDOT:PSS is deposited by spin-coating over the substrate. A layer of the organic electroluminescent polymer poly(9,9-di-n-octylfluorene) is then spin-coated over the layer of PEDOT:PSS. A cathode comprising a 5 nm layer of LiF, a 10 nm layer of Ca and a 100 nm layer of Al is deposited over through a shadow mask. FIG. 3d) shows the shape of the cathode 305 of the organic electroluminescent device. Exposed organic material is then removed by plasma etching leaving the layer of PEDOT:PSS and the layer of poly(9,9-di-n- octylfluorene) beneath the cathode. The organic electroluminescent device is then connected to the organic photovoltaic devices by means of a connector 306 shown in FIG. 3e).

Figure 3F:
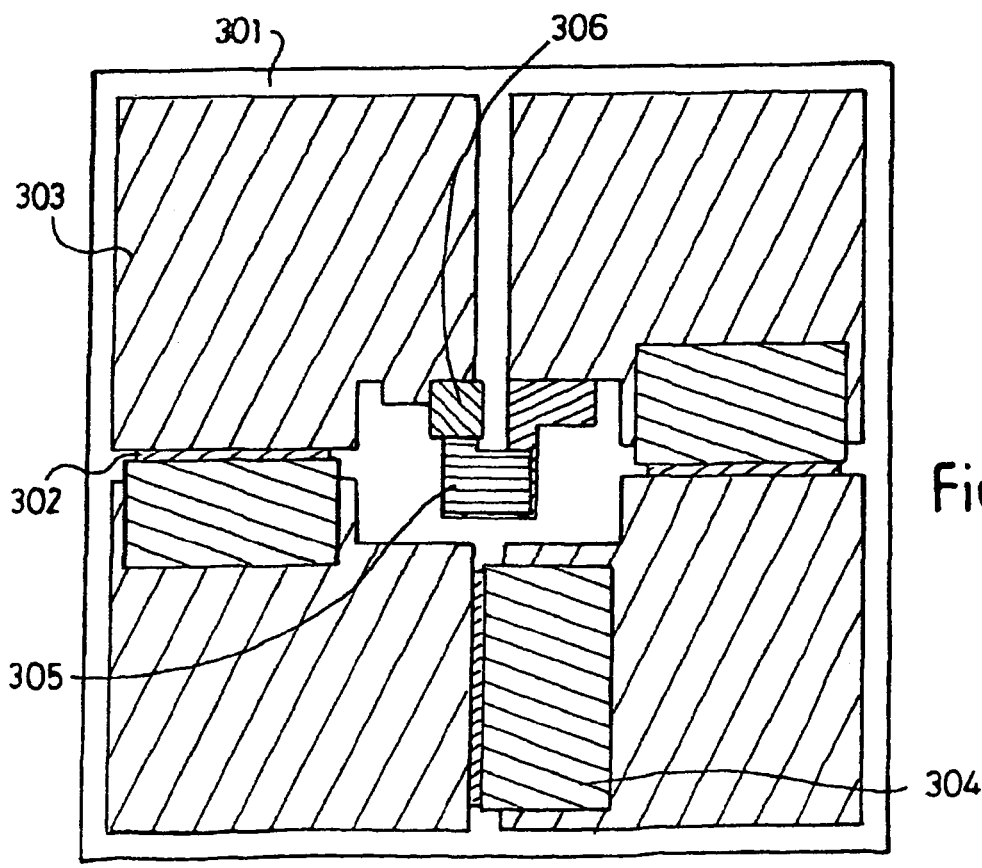

FIG. 3f) shows four organic photovoltaic devices and an organic electroluminescent device connected in series on a single substrate 301. The devices comprise a common anode 302, layers of hole transporting material and photovoltaic material in the organic photovoltaic devices and a layer of hole transport material and a layer of organic electroluminescent material in the organic electroluminescent device. The organic photovoltaic devices comprise cathode 303 and the organic electroluminescent device comprises a cathode 305. The organic photovoltaic devices are connected in series by connectors 304 and the organic electroluminescent devices is connected to the organic photovoltaic devices by connector 306.

Figure 4:
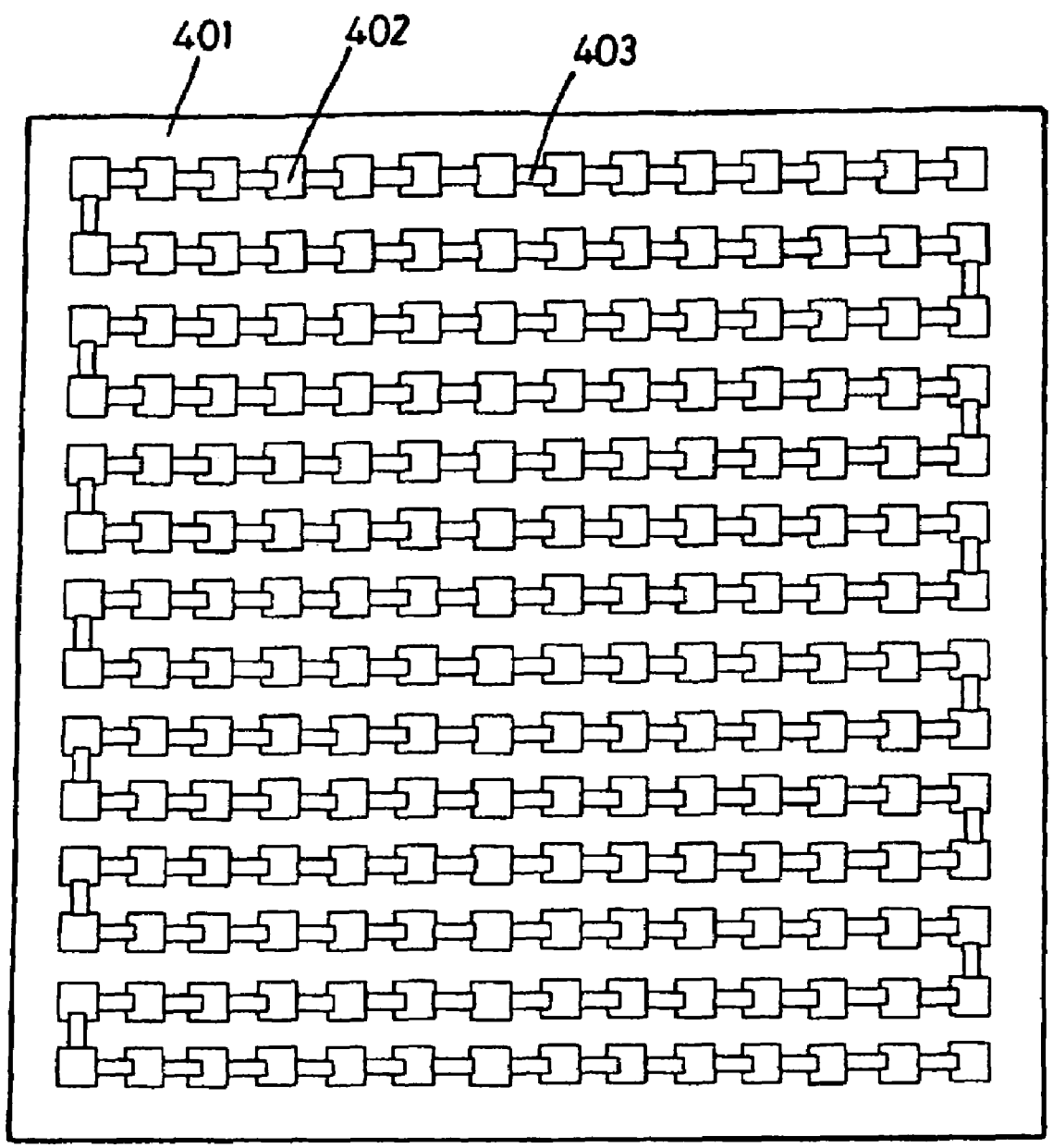
FIG. 4 shows a large array of series connected organic photovoltaic devices for high voltage applications.

FIG. 4 shows an array of series connected organic photovoltaic devices 402 on a single substrate 401. The devices are electrically connected by connectors 403. Such an array may be used to generate high voltages, in the example shown the array of 14×14 organic photovoltaic devices, each capable of generating 1V, may be used to generate up to 196V. The method of the present invention provides an efficient process for connecting large numbers of small organic electronic devices on a single substrate. For example using a substrate of size 150 $mm^2$ and organic photovoltaic devices of size 9 $mm^2$ an array of 30×30 organic photovoltaic devices may be connected in series, generating up to 900V.

Figure 5:
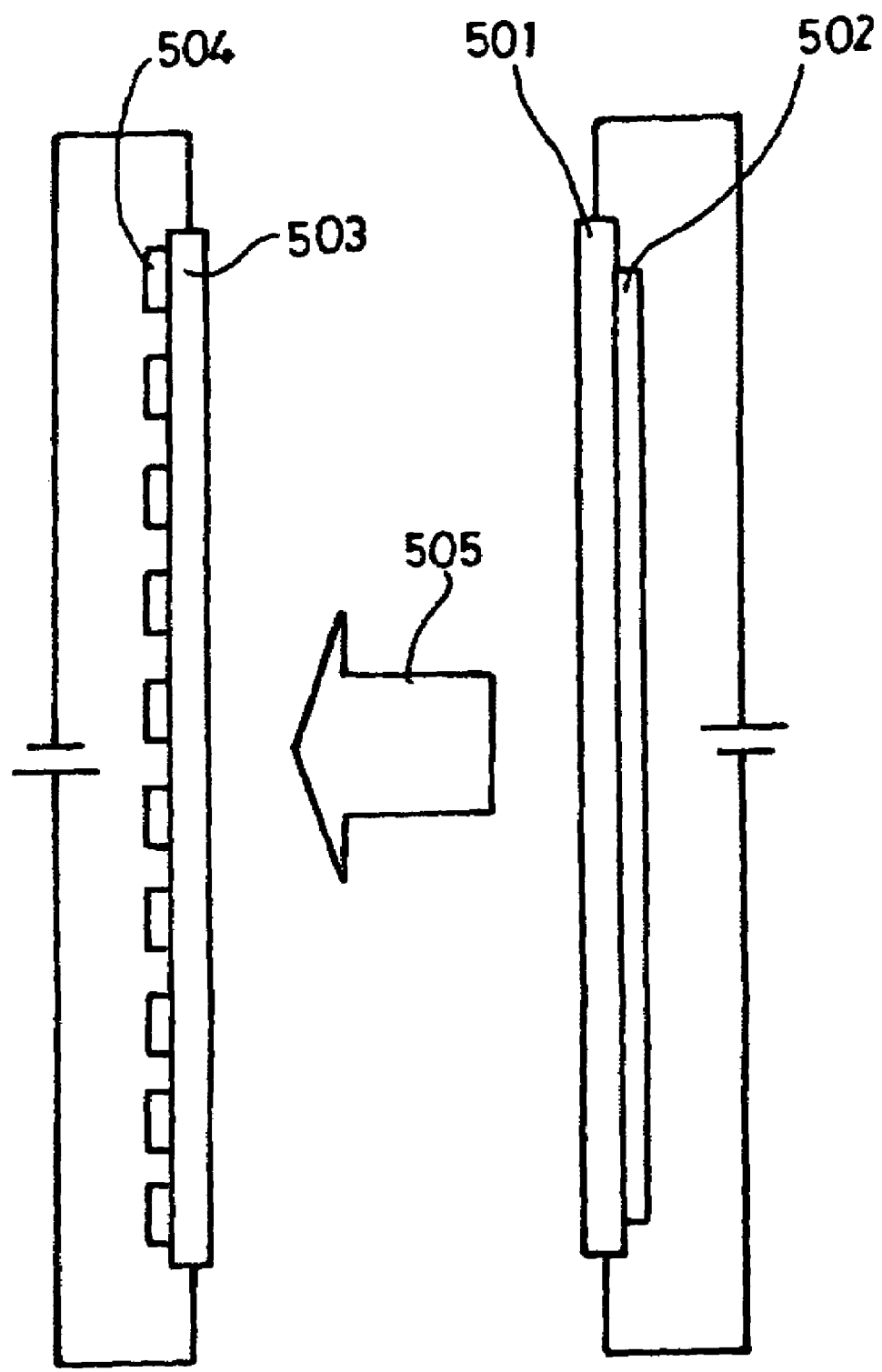
FIG. 5 shows a d.c. voltage converter including a large array of series connected organic photovoltaic devices on a single substrate and a light emitting polymer device.

Large arrays of organic photovoltaic devices have application in d.c. voltage converters such as that shown in FIG. 5. FIG. 5 shows a light emitting polymer device 502 on a glass substrate 501 and a large array of series connected organic photovoltaic devices 504 on a second glass substrate 503 (for clarity the series connectors are not shown). Light is emitted from the light emitting device on the application of a voltage of approximately 4-5V between the electrodes of the device. The emitted light is incident on the organic photovoltaic devices and, as described above, generates a voltage of several hundreds of volts, depending on the number of series connected devices in the array. In this way light may be used to convert a low voltage to a much higher voltage by coupling an organic light emitting device to an array of series connected organic photovoltaic devices. A d.c. voltage converter of the type described may also be prepared by providing the organic light emitting device and the array of series connected organic photovoltaic devices on either side of a single substrate, thereby simplifying the structure of the voltage converter.

EXAMPLE

Series Connected Organic Photovoltaic Devices

A substrate patterned with ITO as shown in FIG. 2a) was cleaned in an ultrasonic bath for ten minutes at 60° C., baked for 20 mins at 110° C. and treated with UV/Ozone for 90 s. 10 ml of an aqueous solution of PEDOT:PSS (available from Bayer as Baytron) was spin-coated onto the substrate and the substrate was baked on a hotplate to remove remaining solvent. A layer of PEDOT:PSS having a thickness of 60 nm was deposited. A solution comprising a 1:1 blend of poly(3-hexylthiophene) and poly(2,7-(9,9-di-n-octylfluorene)-(4,7-di-2-thienyl-(benzothiazole)) at a concentration of 18 mg/l in toluene was spin-coated onto the layer of PEDOT:PSS. A layer of polymer blend of thickness 80 nm was deposited. Aluminium cathodes were deposited over the organic layers through a shadow mask. An initial deposition rate of 0.1 $nms^{-1}$ was maintained to a total thickness of approximately 50 nm, after which the rate was increased to 0.5 nms−1. A total cathode thickness of 300 nm was obtained. FIG. 2b) shows the pattern of the deposited cathodes.

To remove the organic material from regions not covered by the cathode, the substrate was placed in a barrel etcher and treated for three minutes with an $O_2/CF_4$ plasma. The $O_2/CF_4$ plasma treatment was carried out in a RF barrel etcher of dimensions 300 mm diameter, 450 mm depth, with a gas mixture of 0.5-2% $CF_4$ in oxygen, at a pressure of 1.5 Torr and a power of 400 W. Aluminum connectors were then deposited to electrically connect neighbouring devices as shown in FIG. 2d). The connectors were deposited through a shadow mask to a thickness of 300 nm.

The substrate was annealed overnight for approximately 14 hours at 140° C. under vacuum in a glove box furnace. The substrate was encapsulated using a glass cover slide adhered with an epoxy resin.

The four series connected devices were bonded to a pair of electrical leads. The voltage generated by the four series connected devices was measured to be 4V.

No doubt the teaching herein makes many other embodiments of, and effective alternatives to, the present invention apparent to a person skilled in the art. The present invention is not limited to the specific embodiments described herein but encompasses modifications which would be apparent to those skilled in the art and lying with the spirit and scope of the attached claims.

The invention claimed is:

1. A method of preparing a plurality of electrically connected organic optoelectronic devices on a substrate comprising the steps of:
    a) preparing a plurality of organic optoelectronic devices comprising;
        i) providing a substrate,
        ii) providing a patterned layer of a first conductive material over said substrate,
        iii) providing a layer of organic optoelectronic material over said layer of first conductive material and
        iv) providing a patterned layer of a second conductive material over said layer of organic optoelectronic material, said patterned layer of second conductive material covering regions of said layer of organic optoelectronic material, said patterned layer of second conductive material defining a plurality of optoelectronic devices,
    b) at least partially removing regions of said organic optoelectronic material that are not covered by said patterned layer of second conductive material, and,
    c) providing electrical connections to electrically connect at least two of said plurality of organic optoelectronic devices.

2. A method according to claim 1 wherein said step of at least partially removing said organic optoelectronic material comprises removing said organic optoelectronic material using a method selected from the group consisting of dry etching, laser ablation, wet etching and scribing.

3. A method according to claim 1 wherein said step of at least partially removing said organic optoelectronic material comprises removing said organic optoelectronic material using dry etching.

4. A method according to claim 1 wherein said second conductive material partially overlies said first conductive material.

5. A method according to claim 1 wherein either said first conductive material and said substrate are at least semitransparent or said second conductive material is at least semitransparent.

6. A method according to claim 1 wherein said layer of organic optoelectronic material comprises at least an organic electron donor and at least an organic electron acceptor.

7. A method according to claim 6 wherein at least one of said organic electron donor and said organic electron acceptor comprises a semiconductive organic polymer.

8. A method according to claim 1 wherein said organic optoelectronic material comprises a light emitting polymer.

9. A method according to claim 1 further comprising the step of providing a layer of hole injecting or hole transporting material over said patterned layer of first conductive material.

10. A method according to claim 1 wherein said substrate comprises a plastic.

11. A plurality of electrically connected organic optoelectronic devices on a substrate prepared according to the method of claim 1.

12. A plurality of electrically connected organic optoelectronic devices according to claim 11 wherein said organic optoelectronic devices comprise organic photovoltaic devices.

13. A plurality of electrically connected organic optoelectronic devices according to claim 11 wherein said organic optoelectronic devices comprise organic electroluminescent devices.

14. A plurality of electrically connected organic optoelectronic devices according to claim 11 wherein said organic optoelectronic devices comprise organic photovoltaic devices and organic electroluminescent devices.

* * * * *

UNITED STATES PATENT AND TRADEMARK OFFICE
CERTIFICATE OF CORRECTION

PATENT NO. : 7,510,885 B2  Page 1 of 1
APPLICATION NO. : 10/540007
DATED : March 31, 2009
INVENTOR(S) : Jonathan J. Halls et al.

It is certified that error appears in the above-identified patent and that said Letters Patent is hereby corrected as shown below:

At Column 1, lines 48-49, "volatge" should be -- voltage --
        At Column 1, line 53-57, delete "The invention is directed to a method of preparing electronically connected optoelectronic devices such as organic electroluminescent devices and organic photovoltaic devices and to electrically connected devices obtained according to this method."
        At Column 2, line 60, "optoelectronc" should be -- optoelectronic --

Signed and Sealed this

Sixteenth Day of February, 2010

David J. Kappos
*Director of the United States Patent and Trademark Office*